United States Patent
Chu et al.

(10) Patent No.: US 11,967,355 B2
(45) Date of Patent: Apr. 23, 2024

(54) SYSTEMS FOR REDUCING INCONSISTENCIES ACROSS CURRENT MIRROR

(71) Applicant: Micron Technology, Inc., Boise, ID (US)

(72) Inventors: Wei Lu Chu, Shanghai (CN); Dong Pan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/844,207

(22) Filed: Jun. 20, 2022

(65) Prior Publication Data

US 2023/0410877 A1    Dec. 21, 2023

(51) Int. Cl.
*G11C 11/4074*    (2006.01)
*G11C 11/4076*    (2006.01)

(52) U.S. Cl.
CPC ...... *G11C 11/4074* (2013.01); *G11C 11/4076* (2013.01)

(58) Field of Classification Search
CPC ............ G11C 11/4074; G11C 11/4076; H03K 17/6871; H03K 17/6874; H03K 17/6872; H03K 17/693; H03K 17/002; H03K 17/007; H03K 17/735; H03K 17/76
See application file for complete search history.

(56) References Cited

U.S. PATENT DOCUMENTS

2007/0290738 A1* 12/2007 Wendt ................ H03K 17/0822
327/427

* cited by examiner

*Primary Examiner* — Jung Kim
(74) *Attorney, Agent, or Firm* — Fletcher Yoder, P.C.

(57) ABSTRACT

A device includes source circuitry comprising a first portion of a current mirror and a first transistor. The device also includes load circuitry comprising a second portion of the current mirror and a second transistor, wherein the load circuitry is disposed at a distance from the source circuitry. The device further includes a path coupled to a first gate of the first transistor and to a second gate of the second transistor, wherein the path provides a predetermined voltage to both of the first gate of the first transistor and to the second gate of the second transistor.

18 Claims, 5 Drawing Sheets

US 11,967,355 B2

SYSTEMS FOR REDUCING INCONSISTENCIES ACROSS CURRENT MIRROR

BACKGROUND

Field of the Present Disclosure

Embodiments of the present disclosure relate generally to the field of semiconductor devices. More specifically, embodiments of the present disclosure relate to reducing inconsistencies in a current mirror of a semiconductor device.

Description of Related Art

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light and not as admissions of prior art.

Semiconductor devices (e.g., memory devices) may utilize current mirrors to ensure accurate current measurements throughout circuitry. However, across large portions of circuitry, a number of disruptions may alter the voltage and current readings in various locations of the circuitry. Such inconsistencies may negatively affect the functionality of the circuitry. As such, systems that reduce the inconsistencies across a current mirror may be desired.

Embodiments of the present disclosure may be directed to address one or more of the problems set forth above.

BRIEF DESCRIPTION OF DRAWINGS

Various aspects of this disclosure may be better understood upon reading the following detailed description and upon reference to the drawings in which.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Memory devices and other circuitries often utilize current mirrors to control the current through various points of the devices. However, due to various disruptions that may affect the devices, such as ground bounces and power dips, the current may not be accurately controlled through the devices. For example, a small ground bounce or other disturbance in the devices may result in a large difference in current. Such differences may negatively affect the functionality of the memory devices or other circuitries. To remove these inconsistencies, additional ground and power supplies (e.g., predetermined and generated ground and/or power voltage supply sources) may be utilized, as will be explained below.

For example, a source may drive a load located a distance away. To ensure accurate performance, a current mirror may be utilized to drive the current of the load. However, disturbances to the circuitry, such as ground bounce or power dips, may negatively affect the functionality of the current mirror. Accordingly, a ground or positive supply may be applied to both the source circuitry and the load circuitry to overcome the negative effects of the disturbances, as will be described herein.

Figure 1:
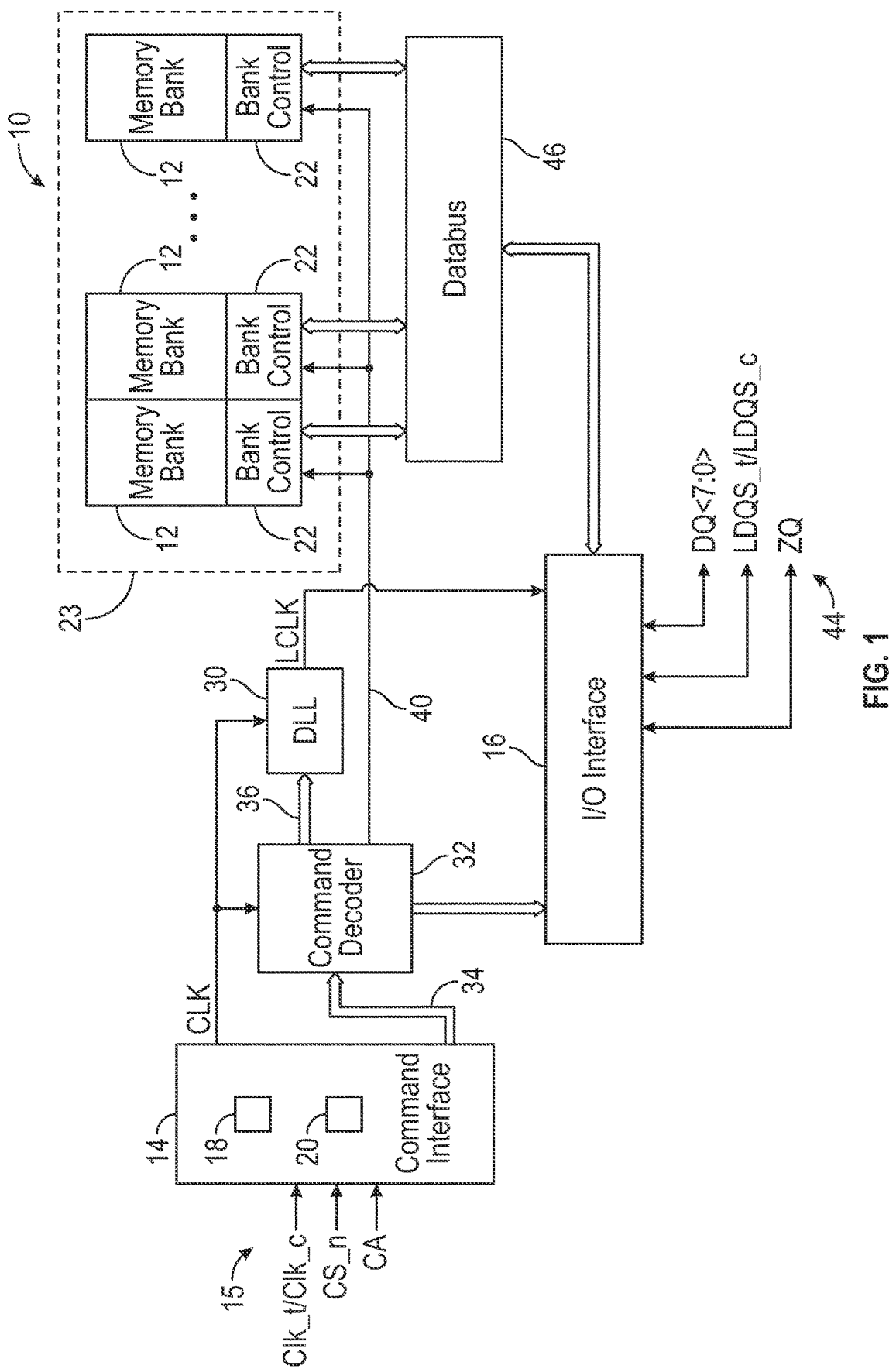
FIG. 1 is a simplified block diagram illustrating some features of a memory device, according to an embodiment of the disclosure.

Turning now to the figures, FIG. 1 is a simplified block diagram illustrating certain features of a memory device 10. While a memory device 10 is illustrated, it should be appreciated that the circuitries and techniques described herein can additionally and/or alternatively be applied to additional devices, such as a system-on-chip, a multi-die package, a processor, any manner of memory device, or any other device. With respect to the example provided in FIG. 1, FIG. 1 is a functional block diagram illustrating certain functionality of the memory device 10. In accordance with one embodiment, the memory device 10 may be a double data rate type five synchronous dynamic random access memory (DDR5 SDRAM) device. Various features of DDR5 SDRAM allow for reduced power consumption, more bandwidth and more storage capacity compared to prior generations of DDR SDRAM.

The memory device 10 may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., x4, x8, or x16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabit (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include a command interface 14 and an input/output (I/O) interface 16. The command interface 14 is configured to provide a number of signals (e.g., signals 15) from an external device (not shown), such as a processor or controller. The processor or controller may provide various signals 15 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t) and the complementary clock signal (Clk_c). The positive clock edge for DDR refers to the point where the rising true clock signal Clk_t crosses the falling complementary clock signal Clk_c, while the negative clock edge indicates that transition of the falling true clock signal Clk_t and the rising of the complementary clock signal Clk_c. Commands (e.g., read command, write command, etc.) are typically entered on the positive edges of the clock signal and data is transmitted or received on both the positive and negative clock edges.

The clock input circuit 18 receives the true clock signal (Clk_t) and the complementary clock signal (Clk_c) and generates an internal clock signal CLK. The internal clock signal CLK is supplied to an internal clock generator 30, such as a delay locked loop (DLL) circuit. The internal clock generator 30 generates a phase controlled internal clock signal LCLK based on the received internal clock signal CLK. The phase controlled internal clock signal LCLK is supplied to the I/O interface 16, for instance, and is used as a timing signal for determining an output timing of read data.

The internal clock signal CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the internal clock generator 30 over the bus 36 to coordinate generation of the phase controlled internal clock signal LCLK. The phase controlled internal clock signal LCLK may be used to clock data through the IO interface 16, for instance.

Further, the command decoder 32 may decode commands, such as read commands, write commands, mode-register set commands, activate commands, etc., and provide access to a particular memory bank 12 corresponding to the command, via bus path 40. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other features, such as timing control and data control, to facilitate the execution of commands to and from the memory banks 12.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t and Clk_c). The command interface may include a command address input circuit 20 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET n) may be used to reset the command interface 14, status registers, state machines and the like, during power-up for instance. The command interface 14 may also receive a command/address invert (CAI) signal which may be provided to invert the state of command/address signals CA<13:0> on the command/address bus. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the IO interface 16. More specifically, the data may be sent to or retrieved from the memory banks 12 over the data path 46, which includes a plurality of bi-directional data buses. Data IO signals, generally referred to as DQ signals, are generally transmitted and received in one or more bi-directional data busses. For certain memory devices, such as a DDR5 SDRAM memory device, the IO signals may be divided into upper and lower bytes. For instance, for a x16 memory device, the IO signals may be divided into upper and lower IO signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t and Clk_c), the data strobe (DQS) signals may be provided as a differential pair of data strobe signals (DQS_t and DQS_c) to provide differential pair signaling during reads and writes. For certain memory devices, such as a DDR5 SDRAM memory device, the differential pairs of DQS signals may be divided into upper and lower data strobe signals (e.g., UDQS_t and UDQS_c; LDQS_t and LDQS_c) corresponding to upper and lower bytes of data sent to and from the memory device for instance.

An impedance (ZQ) calibration signal may also be provided to the memory device 10 through the IO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback signal (LOOPBACK) may be provided to the memory device through the IO interface 16. The loopback signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both a data and a strobe or possibly just a data pin. This is generally intended to be used to monitor the data captured by the memory device 10 at the IO interface 16.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description.

In some embodiments, the memory device 10 may be disposed in (physically integrated into or otherwise connected to) a host device or otherwise coupled to a host device. The host device may include any one of a desktop computer, laptop computer, pager, cellular phone, personal organizer, portable audio player, control circuit, camera, etc. The host device may also be a network node, such as a router, a server, or a client (e.g., one of the previously-described types of computers). The host device may be some other sort of electronic device, such as a copier, a scanner, a printer, a game console, a television, a set-top video distribution or recording system, a cable box, a personal digital media player, a factory automation system, an automotive computer system, or a medical device. (The terms used to describe these various examples of systems, like many of the other terms used herein, may share some referents and, as such, should not be construed narrowly in virtue of the other items listed.)

The host device may, thus, be a processor-based device, which may include a processor, such as a microprocessor, that controls the processing of system functions and requests in the host. Further, any host processor may comprise a plurality of processors that share system control. The host processor may be coupled directly or indirectly to additional system elements of the host, such that the host processor controls the operation of the host by executing instructions that may be stored within the host or external to the host.

Figure 2:
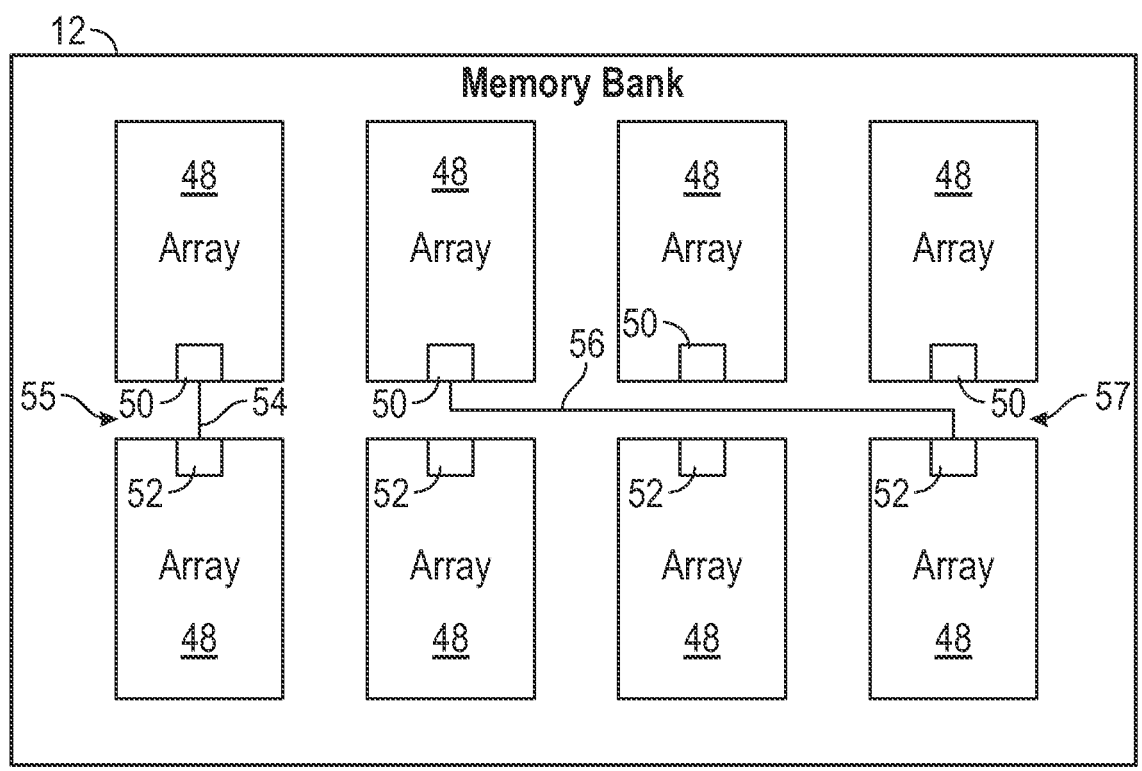
FIG. 2 is a simplified block diagram illustrating a memory bank of the memory device of FIG. 1, according to an embodiment of the disclosure.

Turning now to FIG. 2, a blown up view of one of the memory banks 12 is illustrated. In some embodiments, the memory bank 12 may include multiple arrays 48 comprising logical groupings of memory elements of the memory bank 12. In some embodiments, the arrays 48 may include source circuitry 50 and load circuitry 52. For example the source circuitry 50 may include circuitry to determine and supply a voltage to the load circuitry 52, which may include a load to perform operations of the arrays 48, as previously described. It should be noted that the illustrated embodiment is not intended to be limiting, and that any of the arrays 48 may include the source circuitry 50, the load circuitry 52, or both. Indeed, the source circuitry 50 and the load circuitry 52 may be located anywhere on the memory bank 12. For example, the source circuitry and the load circuitry 52 may be associated with decoders of the memory bank 12, as well as one of the bank control blocks 22 associated with the memory bank 12.

In some embodiments, the source circuitry 50, the load circuitry 52, and a route connecting the two may comprise a current mirror 55. For example, a current mirror 55 includes one of the source circuitries 50 coupled to one of the load circuitries 52 via a path 54, as illustrated. Additionally or alternatively, another example of a current mirror 57 is illustrated as including a path 56 as connecting a source circuitry 50 to a load circuitry 52 to form the current mirror 57, as illustrated. The source circuitries 50 may drive the load circuitries 52 via the respective paths 54 and 56. It should be noted that although a single path 54 and a single path 56 are illustrated, there may be additional connections between the source circuitries 50 and the load circuitries 52. For example, a single source circuitry 50 may connect to more than one load circuitry 52. Accordingly, one of the source circuitries 50 may connect to one load circuitry 52 via a path 54 and to another load circuitry 52 via a path 56. Similarly, other paths may connect a given source circuitry 50 to another load circuitry 52. For example, in some embodiments, several load circuitries 52 may have similar operations as each other. Accordingly, similarly functioning load circuitries 52 may be connected to the same source circuitry 50. Additionally or alternatively, similarly functioning source circuitries 50 may drive similarly functioning load circuitries 52. Additionally, in some embodiments, the source circuitries 50 may be disposed at a central location proximate to some load circuitries 52 and distal to other load circuitries 52 and the current mirrored to the load circuitries may be provided to circuitry associated with (e.g., coupled to) the load circuitries 52, such as amplifier circuits for the memory arrays 48.

Further, it should be noted that although the source circuitries 50 and the load circuitries 52 are described as being part of the memory bank 12, the systems described herein may be applicable to any appropriate device. For example, the source circuitries 50 and load circuitries 52 may be located within a system-on-chip (SoC), a multi-die package, a processor, any manner of memory device, or any other electronic device utilizing current mirrors with a distance between the source circuitry 50 and the load circuitry 52 that results in a voltage drop at the positive supply voltage and/or the negative supply voltage of the load circuitry 52 relative to the source circuitry 50. The discussions herein with respect to memory are descriptive only and the same principles, techniques, and circuitry can be applied to other electronic devices that utilize current mirrors.

Figure 3:
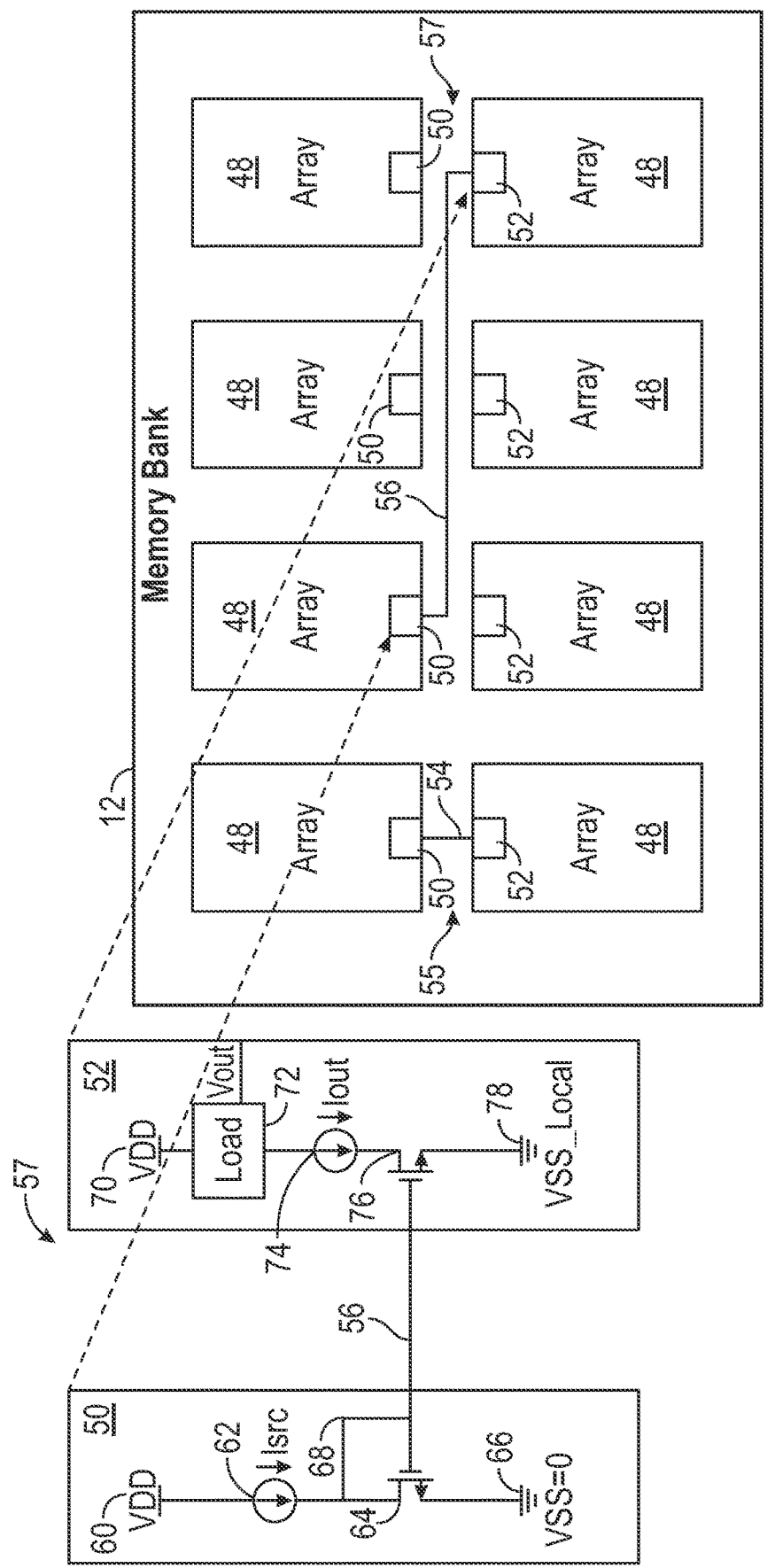
FIG. 3 is a circuit diagram of an embodiment of a current mirror of the memory bank of FIG. 2, according to an embodiment of the disclosure.

Turning now to FIG. 3, the source circuitry 50 and the load circuitry 52 of the current mirror 57 are shown in detail. In some embodiments, in contrast with current mirror 57, for current mirror 55, the distance between the source circuitry 50 and the load circuitry 52 exemplified by path 54 may ensure an accurate performance of the current mirror connecting the source circuitry 50 and the load circuitry 52 (due to the reduced length of path 54 with respect to the length of path 56, which represents a second distance between a respective source circuitry and a load circuitry 52). Indeed, in some embodiments, the distance between the source circuitry 50 and the load circuitry 52 represented by path 56 may introduce a number of disturbances between the source circuitry 50 and the load circuitry 52 that are not present (or are negligible) with respect to the distance between the source circuitry 50 and the load circuitry 52 represented by path 54. For example, slight differences in the VSS local to the load circuitry 52 with respect to the VSS for the source circuitry 50 may be caused by wiring lengths and other similar variables when distances are similar to or are the same as the length of the path 56. Accordingly, in some embodiments, the distance represented by path 56 between the source circuitry 50 and the load circuitry 52 may contribute to a faulty performance of the current mirror 57. For reference, example lengths of the distance of path 56 may be, for example, approximately 50 μm, 100 μm, 250 μm, 500 μm, 1000 μm, or another value.

In some embodiments, the source circuitry 50 may receive a positive supply voltage VDD 60. The VDD 60 may be supplied by a voltage generator or other appropriate source. The VDD 60 may be 3.3V, 2.8V, 1V, or any other appropriate voltage. A source current 62 (e.g., a reference current) flows to the drain of a transistor 64. The source of the transistor 64 may be coupled to a negative supply voltage VSS 66. In some embodiments, the VSS 66 may be zero or approximately zero (e.g., 0 mV, −10 mV, 10 mV, −20 mV, 20 mV, −30 mV, 30 mV, −40 mV, 40 mV, −50 mV, −100 mV, 100 mV, or the like). In some embodiments, the VSS 66 may be tied to a ground pin located on the memory bank 12, such as within one of the arrays 48. It should be noted that although the illustrated embodiment of FIG. 3 describes the transistor 64 as being an NMOS transistor, in some embodiments, the source circuitry 50 and the load circuitry 52 may utilize other circuit components. For example, PMOS transistors, BJT transistors, or other circuitries may be used in place of the illustrated NMOS transistor 64.

To ensure that the source current 62 is properly mirrored (i.e., copied) to the load circuitry 52, the drain and the gate of the transistor 64 are coupled via a path 68. The gate of the transistor 64 may connect directly to load circuitry 52 (e.g., to a gate of transistor 76 of the load circuitry 52) via the path 56. Additionally, the load circuitry 52 may receive a positive supply voltage VDD 70, which may originate from the same source as the VDD 60. For example, in some embodiments an external voltage generator may supply the VDD 60 and 70. Alternatively, in some embodiments the VDD 70 may be supplied by a different voltage source. Additionally or alternatively, an internal voltage generator may be used to supply a local drain voltage to VDD 60, VDD 70, or both. In some embodiments, using a local voltage generator may help avoid headroom issues within transistors of the source circuitry 50 and the load circuitry 52, as will be described herein. A load 72 may additionally be present in the load circuitry 52. This load 72 may be, for example, a circuit element (e.g., a resistor, a transistor, or the like) or may be a more complex circuit that utilizes the bias generated via the current mirror 57. As illustrated, the load 72 can provide particular voltage as an output, for example at a Vout pin. Moreover, the load 72, in some embodiments, may be omitted.

An output current 74 may flow from the load 72 to a drain of a transistor 76. Further, although the output current 74 may be equivalent to the source current 62 (i.e., a 1:1 ratio), in some embodiments, the current mirror 57 may be configured to adjust the output current 74 according to a ratio. For example, in some embodiments, the output current 74 may be 1/N the value of the source current 62, based on characteristics of the transistors 64 and 76, among other things. The source of the transistor 76 may be connected to a negative supply voltage VSS 78. In some embodiments, the VSS 78 may be −100 mV, −50 mV, −40 mV, −30 mV, −20 mV, −10 mV, 0 mV, 10 mV, 20 mV, 30 mV, 40 mV, 50 mV, 100 mV, or the like. The transistor 76 may, as previously mentioned, be a NMOS transistor. Further, PMOS transistors, BJT transistors, or other circuitries may also be used in place of the load circuitry 52.

As mentioned, the current mirror 57 operates to copy the source current 62 to the output current 74 (i.e., to equalize the source current 62 and the output current 74). As illustrated, path 56 connects the gate of the transistor 64 to the gate of the transistor 76. In some embodiments, this may ensure that the source current 62 is identical to the output current 74 despite variances between the VSS 66 and the VSS 78 that may be introduced by the distances between the source circuitry 50 and the load circuitry 52, as exemplified by the path 56. Further, this may ensure that the same source current 62 is identical to the output current 74 despite variances between the VDD 60 and the VDD 70, as will be discussed herein.

It may be desirable to maintain a constant relationship between the source current 62 and the output current 74, whether it be a 1:1 ratio or a 1:N ratio (e.g., where the size of N can be selectable, for example, through selection of the transistor 76 as being different than transistor 64). However, in some embodiments, the distances between the source circuitry 50 and the load circuitry 52 (e.g., distances exemplified by path 56, for example, the same or similar length as path 56) may introduce discrepancies between the source circuitry 50 and the load circuitry 52. For example, based on the distances between the source circuitry 50 and the load circuitry 52 (e.g., distances the same as or similar to the length of the path 56), the VSS 78 may be slightly (or significantly) different from the VSS 66 (e.g., the differences in VSS 66 and VSS 78 may be 10 mV, 20 mV, or another value). This is due to the path distance of a VSS path that transmits the VSS voltage (e.g., VSS 66) from the source circuitry 50 to the load circuitry 52 (resulting in VSS 78 having a drop relative to VSS 66 due to the VSS path that may have a distance similar to or the same as the path 56). The differences in these VSS 66 and VSS 78 values cause the gate to source voltages of the transistor 64 to differ from the gate to source voltage of the transistor 76, which causes a difference in the source current 62 and the output current 74.

Thus, in embodiments where the VSS 66 and the VSS 78 are supplied from the same source, the distance between the VSS 66 and the VSS 78 may introduce discrepancies between the source voltages (e.g., when path 56 is present relative to path 54 being present, illustrative of a greater corresponding length of the VSS path between the source circuitry 50 and the load circuitry 52). For example, the length of the path 56 may be 1000 μm. However, other distances may also introduce discrepancies. For example, 50 μm, 100 μm, 200 μm, 300 μm, 400 μm, 500 μm, 600 μm, 700 μm, 800 μm, 900 μm, 2000 μm, or another length of the path 56 may represent distances between the source circuitry 50 and the load circuitry 52 that introduce discrepancies between the VSS 66 and the VSS 78 (and/or the VDD 60 and VDD 70). In other embodiments, the distance of the path 56 itself may be less of an issue than the distance of the path 56 in conjunction with the width of the routing between the source circuitry 50 and the load circuitry 52 (e.g., a distance of 50 μm for path 56 but a width of the routing of 100 μm may have a greater impact on the discrepancies between the VSS 66 and the VSS 78 and/or the VDD 60 and VDD than a distance of 100 μm for path 56 but a width of the routing of 10 μm). Likewise, it may be current passed between the source circuitry 50 and the load circuitry 52 that introduce discrepancies between the VSS 66 and the VSS 78.

One such discrepancy may be a ground bounce on the VSS 78. For example, when the source for VSS 66 (e.g., a local ground) is located proximate to the source circuitry 50 (e.g., at or approximately at a distance of path 54), then the VSS 66 may match the source voltage (e.g., 0 V). However, as the distance between the source for VSS 66 and VSS 78 increases relative to the load circuitry 52, this distance (e.g., at or approximately at a distance of path 56), as well as other factors, may cause the VSS 78 to be different than (e.g., be higher than) the VSS 66. Specifically, in some embodiments, the wiring that connects the source circuitry 50 to the load circuitry 52 to provide the VSS 78 may introduce a ground bounce to the VSS 78. Indeed, in some embodiments, the number of wires (lanes), as well as the width of each wire may cause the ground bounce. For example, the ground bounce may associated with a quotient of the number of lanes and the width of each wire.

A ground bounce from the source circuitry 50 to the load circuitry 52 may cause the VSS 78 to be higher than the VSS 66, for example by 50 mV. The discrepancy may cause a difference between the source current 62 and the output current 74, causing failure in the operation of the current mirror 57. Further, it should be noted that although the example of a discrepancy has been described, the ground bounce or other variance between the VSS 66 and the VSS 78 may be more or less. Indeed, even a slight difference between the VSS 66 and the VSS 78 may result in inaccurate operations of the current mirror 57.

Figure 4:
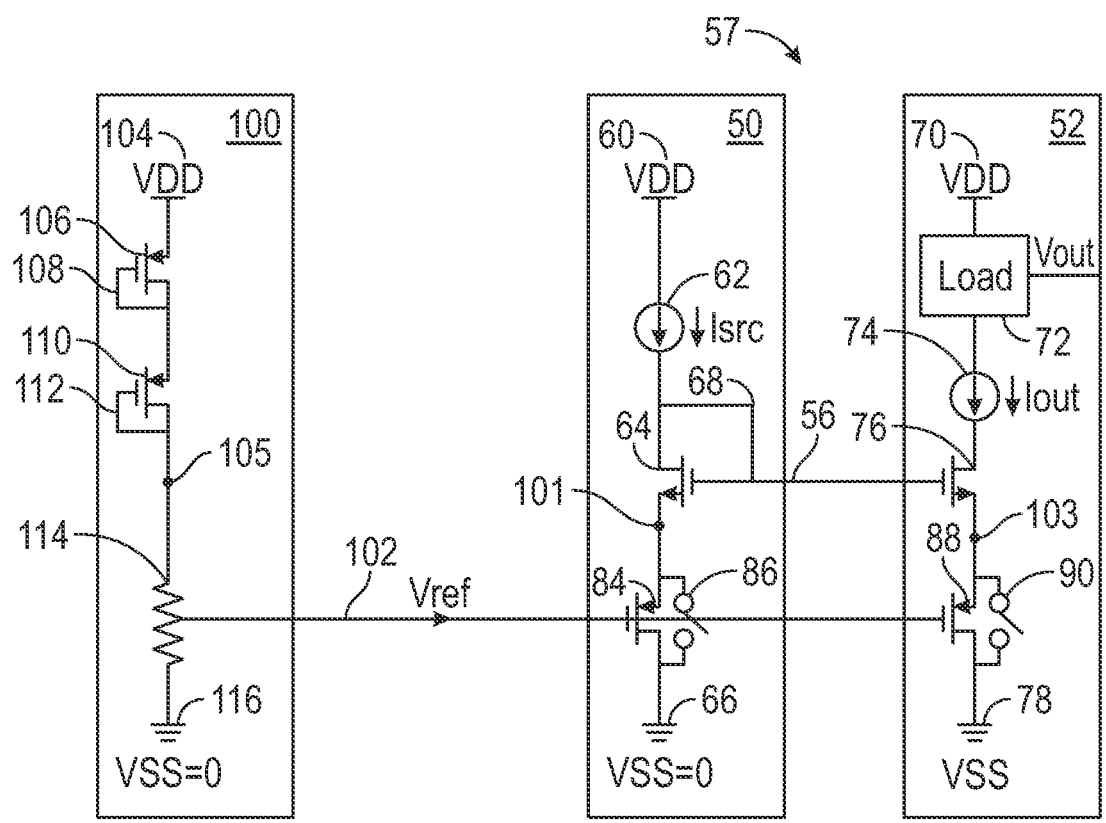
FIG. 4 is a circuit diagram of ground generating circuitry coupled to a second embodiment of a current mirror of the memory bank of FIG. 2, according to an embodiment of the disclosure.

To resolve the issues presented by the distance between the source for VSS 66 and VSS 78 relative to the load circuitry 52 (e.g., at or approximately at a distance of path 56), FIG. 4 illustrates an example embodiment of ground generating circuitry 100 configured to supply a grounding voltage 102 to the source circuitry 50 and the load circuitry 52. Indeed, the grounding voltage 102 may help overcome the effects of ground bounce and other inaccuracies caused by the distance similar to path 56 by insuring that the voltage at the source of the transistor 64 at point 101 and the voltage at the source of the transistor 76 at point 103 are the same or approximately the same (i.e., the Vgs of each of each of the transistor 64 and the transistor 76 are the same or approximately the same). This will operate to cancel any discrepancies that would cause the VSS 78 to be higher than the VSS 66, for example by 50 mV, as will be discussed in greater detail below.

This result of having the voltages at point 101 and point 103 being equal or approximately equal can be achieved through the inclusion of additional circuitry in each of the source circuitry 50 and the load circuitry 52, for example, transistors 84 and 88, respectively, which each receive the grounding voltage 102 at the respective gates. In some embodiments, the transistors 84 and 88 may be, for example, PMOS transistors and, more particularly, can be P channel zero voltage transistors, although other types of transistors can be utilized instead. As illustrated, the voltage at point 101 will be the grounding voltage 102 plus the threshold voltage (Vt) of the transistor 84 (i.e., the gate to source voltage to create a conducting path between the source (adjacent point 101) of the transistor 84 and the drain (adjacent VSS 66) of the transistor 84). Likewise, the voltage at point 103 will be the grounding voltage 102 plus the threshold voltage (Vt) of the transistor 88 (i.e., the gate to source voltage to create a conducting path between the source (adjacent point 103) of the transistor 88 and the drain (adjacent VSS 78) of the transistor 88). In this manner, the voltages at each of point 101 and point 103 are clamped.

To insure that the voltage at point 101 and point 103 is the same or approximately the same, the grounding voltage 102 and/or the transistors 84 and 88 may be selected to generate a desired voltage at each of point 101 and 103. For example, if the grounding voltage 102 is set to 0 V and the Vt of each of transistor 84 and transistor 88 is 200 mV (i.e., through selection of transistors 84 and 88 having this Vt characteristic), then the voltage at each of point 101 and point 103 will be the grounding voltage 102 (e.g., 0 V) plus the Vt (e.g., 200 mV) for a total of 200 mV. In situations where the difference between the VSS 66 and the VSS 78 is, for example, the difference between the voltages at VSS 66 and the VSS 78 no longer generates a difference in voltages at point 101 and point 103. That is, by using transistors 84 and 88, the voltages at points 101 and 103 can be set to a voltage that is greater than a voltage difference between VSS 66 and VSS 78, thus "eating" or "absorbing" the voltage difference between VSS 66 and VSS 78 and ensuring that the voltages at points 101 and 103 are the same or approximately the same (i.e., to ensure the accurate operation of the current mirror 57 of the source circuitry 50 and the load circuitry 52).

As noted previously, selection of a desired grounding voltage 102 and/or the transistors 84 and 88 insures that the voltage at point 101 and point 103 is the same or approximately the same. For example, when the grounding voltage 102 the grounding voltage 102 and/or the transistors 84 and 88 are selected differently, a desired voltage at each of point 101 and 103 may not be generated. For example, if the grounding voltage 102 is set to 0 V and the Vt of each of transistor 84 and transistor 88 is 10 mV (i.e., through selection of transistors 84 and 88 having this Vt characteristic), then the voltage at point 101 will be 10 mV. However, if the VSS 78 is still 50 mV, transistor 88 will be operational, for example, as a switch that passes the voltage of VSS 78 of 50 mV to pass to point 103, causing a difference in the voltages at point 101 and point 103, thus affecting the operation of the current mirror 57. In this manner, selection of the transistors 84 and 88 and/or generation of a grounding voltage 102 having a particular voltage to insure that the voltage at point 101 and point 103 are the same or approximately the same is useful to ensure the accurate operation of the current mirror 57 of the source circuitry 50 and the load circuitry 52.

In some embodiments, the ground generating circuitry 100 can be omitted and the grounding voltage 102 may instead be coupled to ground. However, if the grounding voltage 102 is fixed to a ground, the ground bounce (i.e., the voltage level of VSS 78) may differ from, for example, chip to chip in which the load circuitry 52 is implemented. Likewise, processing differences in the manufacture of the transistors 84 and 88 can additionally lead to variations in the Vt thereof (e.g., processing differences in the transistors 84 and 88 can cause their individual Vt values to be located in a range of 50 mV to 150 mV). Thus, in situations wherein manufacture of one or both transistors 84 and 88 result in a Vt on the low end of the Vt range (e.g., at or approximately at 50 mV), the resulting transistor 84 and/or 88 would be unable to "eat" or "absorb" the voltage difference between VSS 66 and VSS 78 (e.g., when VSS 78 at least 50 mV or higher) and would not ensure that the voltages at points 101 and 103 were the same or approximately the same. Accordingly, while in some embodiments, the ground generating circuitry 100 can be omitted and the grounding voltage 102 may instead be coupled to ground (e.g., through selection of particular transistors 84 and 88 that have sufficient Vt values to absorb the VSS 78 voltage value even when their manufacturing tolerances are taken into account), in other embodiments, the ground generating circuitry 100 may instead be employed to dynamically generate the grounding voltage 102 at a particular value.

In some embodiments, the ground generating circuitry 100 may be located on the memory bank 12. However, alternate locations for the ground generating circuitry 100 in the memory device 10 are envisioned. To generate the grounding voltage 102, the ground generating circuitry 100 may include a positive supply voltage VDD 104 (e.g., a regulated voltage supply with a voltage of, for example, 1.2V) connected to one or more of transistor 106 and transistor 110. The VDD 104 may come from any of the voltage generators described in relation to VDD 60 and VDD 70 or a separate internal or external voltage generator. Additionally, transistors 106 and 110 may be of a same type as transistors 84 and 88, for example, PMOS transistors and, more particularly, they can be P channel zero voltage transistors, although other types of transistors can be utilized instead. A path 108 may couple the gate and the drain of the transistor 106. Further, the drain of the transistor 106 may be coupled to the source of transistor 110. The transistor 110 may also have a path 112 to couple the gate of the transistor 110 and the drain of the transistor 110. A resistor 114 located on the ground generating circuitry 100 may establish the grounding voltage 102 supplied to the source and load circuitries 50 and 52.

In operation, when the Vt of transistors 84 and 88 is relatively low (e.g., at 50 mV), then the corresponding Vt of transistors 106 and 110 will likewise be relatively low, as similar transistors can be employed for each of transistors 84, 88, 106, and 110 (i.e., each having similar or approximately the same operating characteristics as one another). The low Vt in transistors 106 and 110 causes a resultant voltage drop between the VDD 104 and the voltage at point 105 to be minimal, resulting in a grounding voltage 102 that is higher (e.g., sufficient that when added to the low Vt value of transistor 88, the resulting voltage at point 103 is large enough to absorb the VSS 78 voltage value, for example, 100 mV, 200 mV or a similar value).

Likewise, when the Vt of transistors 84 and 88 is relatively high (e.g., at 100 mV, 150 mV, 200 mV or a similar value), then the corresponding Vt of transistors 106 and 110 will likewise be relatively high, as similar transistors can be employed for each of transistors 84, 88, 106, and 110. The high Vt in transistors 106 and 110 causes a resultant voltage drop between the VDD 104 and the voltage at point 105 to be increased, resulting in a lowered grounding voltage 102 (e.g., less voltage for the grounding voltage 102 is sufficient when added to the higher Vt value of transistor 88, such that the resulting voltage at point 103 is large enough to absorb the VSS 78 voltage value, for example, 100 mV, 200 mV or a similar value). In this manner, the ground generating circuitry 100 may dynamically generate the grounding voltage 102 and may compensate, for example, for manufacturing differences in transistors 84, 88, 106, and 110 to insure that the grounding voltage 102 and the Vt overcome the voltage difference between VSS 66 and VSS 78. It should be noted that the described arrangement of transistors and current mirrors may, in some embodiments, be accomplished by alternate circuitries. For example, although PMOS transistors are disclosed in the illustrated example of FIG. 4 with respect to transistors 84, 88, 106, and 110, NMOS transistors, BJTs, or other circuitries may be utilized to produce similar results.

As described above, a small variance between the VSS 66 and the VSS 78 may cause the current mirror 57 to malfunction. The grounding voltage 102 may resolve this issue by cancelling the effects of any ground bounce or other variation between the VSS 66 and the VSS 78. For example, when the VSS 78 is 50 mV higher than VSS 66, supplying a grounding voltage 102 larger than 50 mV to the gates of the transistors 84 and 88 may overcome the differences between the VSS 66 and the VSS 78. Ensuring that the voltages at point 101 and point 103 are the same, or nearly the same, may allow the current mirror 57 to properly control the output current 74. Further, it should be noted that in some embodiments, if the grounding voltage 102 and the Vt combined is not greater than the VSS 78, then the voltages at point 101 and point 103 may not be the same. As described above, use of the ground generating circuitry 100 as described above can operate to minimize and/or eliminate this outcome through, for example, dynamic generation of the grounding voltage 102.

Indeed, in some embodiments, the VSS 78 may experience ground bounces smaller or larger than 50 mV. For example, 10 mV, 20 mV, 30 mV, 40 mV, 100 mV, 150 mV, 200 mV, or the like may be experienced by the VSS 78. The ground bounce on the VSS 78 may be based on the wiring between the VSS 66 and the VSS 78 and other factors. Accordingly, to properly overcome the ground bounce, the grounding voltage 102 may be dynamically generated in conjunction with the transistors 84, 88, 106, and 110 selected to overcome the ground bounce of the VSS 78 (e.g., the voltage difference between VSS 66 and VSS 78).

In some embodiments, providing too large of a grounding voltage 102 may result in headroom issues in the source circuitry 50 and the load circuitry 52. For example, as the voltage at point 101 and 103 increased (e.g., in conjunction with an increase to the grounding voltage 102), the voltage of VDD 60 and VDD 70 may eventually be less than the voltage at point 101 and 103, causing additional functionality issues in the current mirror 57. To resolve this potential issue caused by an increase of the voltages at points 101 and 103, an internally generated power supply may operate to generate the VDD 60 and/or the VDD 70 to a predetermined level for example, to reduce and/or eliminate the above described headroom issue.

Further, in some embodiments, it may be useful to desirable to forgo the use of ground generating circuitry 100 and/or to eliminate the use of the grounding voltage 102. The source circuitry 50 and the load circuitry 52 may each include a respective switch 86 and 90 that operate as a bypass switch for each of transistor 84 and 88. The switch 86 and 90 may each be a transistor (e.g., an NMOS transistor) or other similar circuit that functions to generate an open and closed path. In some embodiments, the memory device 10 may be tested (e.g., post-manufacture testing) to determine whether differences in VSS 78 and VSS 66 impact the operation of the current mirror 57. This testing may include closing each of the switches 86 and and testing the operation of the current mirror 57. If the current mirror 57 operates correctly with the switches 86 and 90 in a closed position, then little difference in VSS 78 and VSS 66 is present and there is no need to utilize the transistors 84 and 88 and/or the ground generating circuitry 100 (i.e., the transistors 84 and 88 and/or the ground generating circuitry 100 are disabled). If, however, during (post-manufacturing) testing the current mirror 57 is shown to fail when each of the switches 86 and 90 is closed, the switches 86 and 90 can be opened, thus utilizing the transistors 84 and 88 and/or the ground generating circuitry 100 in the manner discussed above. However, it should also be appreciated that there may be other reasons to forgo use of the ground generating circuitry 100 and the transistors 84 and 88, such as cost, efficiency, and the like.

The circuitry described above in conjunction with FIG. 4 can be used in conjunction with NMOS transistors 64 and 76 for the current mirrors. However, the techniques described above can similarly be used in conjunction with PMOS transistors of the current mirror. An example of this circuitry is provided in conjunction with FIG. 5

Figure 5:
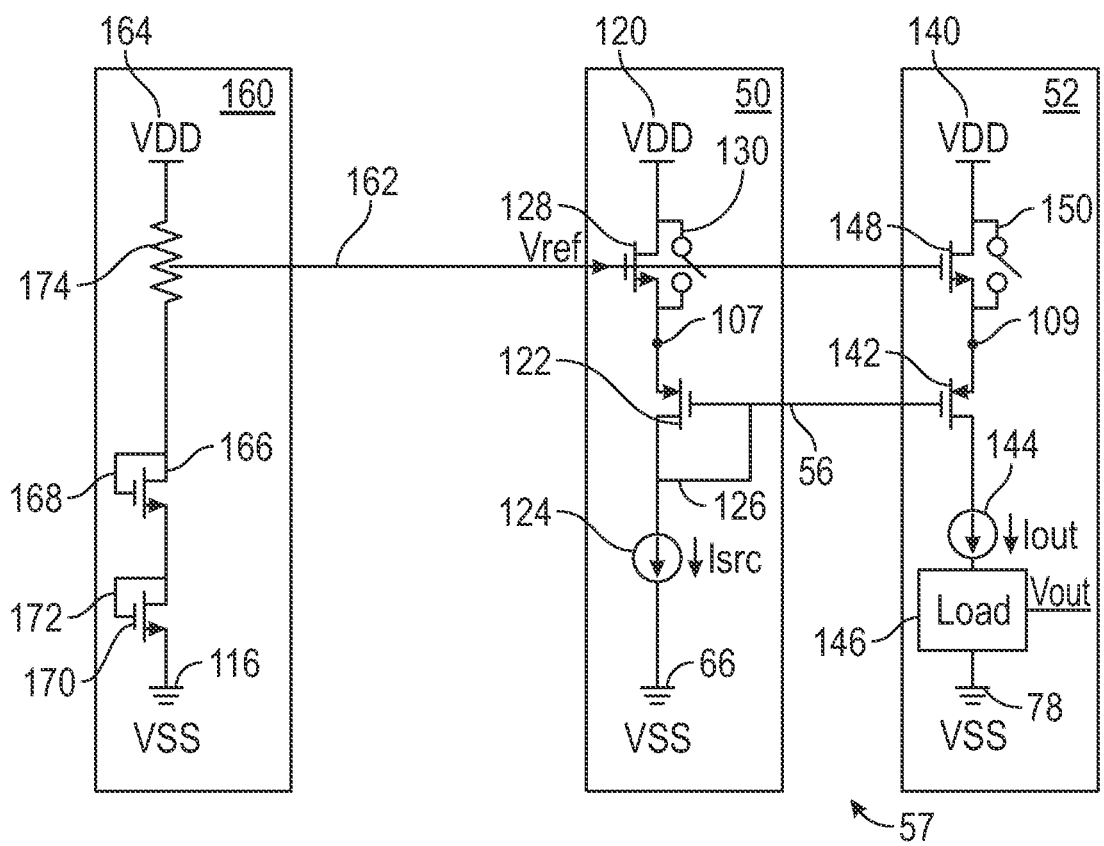
FIG. 5 is a circuit diagram of positive supply generating circuitry coupled to a third embodiment of a current mirror of the memory bank of FIG. 2, according to an embodiment of the disclosure.

As illustrated in FIG. 5, the source circuitry 50 and the load circuitry 52 of the current mirror 57 are shown in detail. The distance between the source circuitry 50 and the load circuitry 52, represented by path 56, may introduce a number of disturbances between the source circuitry 50 and the load circuitry 52 that are not present (or are negligible) with respect to the distance between the source circuitry 50 and the load circuitry 52 represented by path 54. For example, slight differences in the VDD 140 local to the load circuitry 52 with respect to the VDD 120 for the source circuitry 50 may be caused by wiring lengths and other similar variables when distances are similar to or are the same as the length of the path 56. Accordingly, in some embodiments, the distance represented by path 56 between the source circuitry 50 and the load circuitry 52 may contribute to a faulty performance of the current mirror 57. For reference, example lengths of the distance of path 56 may be, for example, approximately 50 µm, 100 µm, 250 µm, 500 µm, 1000 µm, or another value.

In some embodiments, the source circuitry 50 may receive a positive supply voltage VDD 120. The VDD 120 may be supplied by a voltage generator or other appropriate source. The VDD 120 may be 3.3V, 2.8V, 1V, or any other appropriate voltage. A source current 124 (e.g., a reference current) flows from the drain of a transistor 122 to a negative voltage VSS 66. In some embodiments, the VSS 66 may be zero or approximately zero (e.g., 0 mV, −10 mV, −20 mV, 20 mV, −30 mV, 30 mV, −40 mV, 40 mV, −50 mV, 50 mV, −100 mV, 100 mV, or the like). In some embodiments, the VSS 66 may be tied to a ground pin located on the memory bank 12, such as within one of the arrays 48. It should be noted that the illustrated embodiment includes the transistor 122 as a PMOS transistor, however, in some embodiments, the source circuitry 50 and the load circuitry 52 may utilize other circuit components. For example, NMOS transistors, BJT transistors, or other circuitries may be used in place of the illustrated PMOS transistor 122.

To ensure that the source current 124 is properly mirrored (i.e., copied) to the load circuitry 52 as output current 144, the drain and the gate of the transistor 122 are coupled via a path 126. The gate of the transistor 122 may connect directly to load circuitry 52 (e.g., to a gate of transistor 142 of the load circuitry 52) via the path 56. A load 146 may additionally be present in the load circuitry 52 and coupled to a negative supply voltage VSS 78. This load 146 may be, for example, a circuit element (e.g., a resistor, a transistor, or the like) or may be a more complex circuit that utilizes the bias generated via the current mirror 57. As illustrated, the load 146 can provide particular voltage as an output, for example at a Vout pin. Moreover, the load 146, in some embodiments, may be omitted. In some embodiments, the VSS 78 may be −100 mV, −−40 mV, −30 mV, −20 mV, −10 mV, 0 mV, 10 mV, 20 mV, 30 mV, 40 mV, 50 mV, 100 mV, or the like. The transistor 142 may, as previously mentioned, be a PMOS transistor. Further, PNOS transistors, BJT transistors, or other circuitries may also be used in place of the transistor 142 in the load circuitry 52.

As previously, noted, an output current 144 may be the mirrored current generated by the current mirror 57. Further, although the output current 144 may be equivalent to the source current 124 (i.e., a 1:1 ratio), in some embodiments, the current mirror 57 may be configured to adjust the output current 144 according to a ratio. For example, in some embodiments, the output current 144 may be 1/N the value of the source current 124, based on characteristics of the transistors 122 and 142, among other things.

As mentioned, the current mirror 57 operates to copy the source current 124 to the output current 144 (i.e., to equalize the source current 124 and the output current 144). As illustrated, path 56 connects the gate of the transistor 122 to the gate of the transistor 142. In some embodiments, this may ensure that the source current 124 is identical to the output current 144 despite variances between the VDD 120 and the VDD 140 that may be introduced by the distances between the source circuitry 50 and the load circuitry 52, as exemplified by the path 56.

It may be desirable to maintain a constant relationship between the source current 124 and the output current 144, whether it be a 1:1 ratio or a 1:N ratio (e.g., where the size of N can be selectable, for example, through selection of the transistor 142 as being different than transistor 122). However, in some embodiments, the distances between the source circuitry 50 and the load circuitry 52 (e.g., distances exemplified by path 56, for example, the same or similar length as path 56) may introduce discrepancies between the source circuitry 50 and the load circuitry 52. For example, based on the distances between the source circuitry 50 and the load circuitry 52 (e.g., distances the same as or similar to the length of the path 56), the VDD 120 may be slightly (or significantly) different from the VDD 140 (e.g., the differences in VSS 66 and VSS 78 may be 10 mV, 20 mV, or another value). This is due to the path distance of a VDD path that transmits the VDD voltage (e.g., VDD 120) from the source circuitry 50 to the load circuitry 52 (resulting in VDD 140 having a drop relative to VDD 120 due to the VDD path that may have a distance similar to or the same as the path 56). The differences in these VDD 120 and VDD 140 values cause the voltage at point 107 to differ from the voltage at point 109, which causes a difference in the source current 124 and the output current 144.

Thus, in embodiments where the VDD 120 and the VDD 140 are supplied from the same source, the distance between the VDD 120 and the VDD 140 may introduce discrepancies between the source voltages of the current mirror (i.e., voltages at points 107 and 109). In other embodiments, the distance of the path 56 itself may be less of an issue than the distance of the path 56 in conjunction with the width of the routing between the source circuitry 50 and the load circuitry 52 (e.g., a distance of 50 μm for path 56 but a width of the routing of 100 μm may have a greater impact on the discrepancies between the VDD 120 and the VDD 140 than a distance of 100 μm for path 56 but a width of the routing of 10 μm). Likewise, it may be current passed between the source circuitry 50 and the load circuitry 52 that introduce discrepancies between the VDD 120 and the VDD 140.

One such discrepancy may be a power dip on the VDD 140. For example, when the source for VDD 140 (e.g., a local power) is located proximate to the source circuitry 50 (e.g., at or approximately at a distance of path 54), then VDD 140 may match the source voltage (e.g., 1.2V). However, as the distance between the source for VDD 120 and VDD 140 increases relative to the load circuitry 52, this distance (e.g., at or approximately at a distance of path 56), as well as other factors, may cause the VDD 140 to be different than (e.g., be higher than) the VDD 120. Specifically, in some embodiments, the wiring that connects the source circuitry 50 to the load circuitry 52 to provide the VDD 120 may introduce a power dip to the VDD 140. Indeed, in some embodiments, the number of wires (lanes), as well as the width of each wire may cause the power dip. For example, the power dip may associated with a quotient of the number of lanes and the width of each wire.

A power dip from the source circuitry 50 to the load circuitry 52 may cause the VDD 140 to be lower than the VDD 120, for example by 50 mV. The discrepancy may cause a difference between the source current 124 and the output current 144, causing failure in the operation of the current mirror 57. Further, it should be noted that although the example of a discrepancy has been described, the power dip or other variance between VDD 120 and VDD 140 may be more or less. Indeed, even a slight difference between VDD 120 and VDD 140 may result in inaccurate operations of the current mirror 57.

To resolve the issues presented by the distance between the source for VDD 120 and VDD 140 relative to the load circuitry 52 (e.g., at or approximately at a distance of path 56), FIG. 5 illustrates an example embodiment of positive supply circuitry 160 configured to supply a positive supply voltage 162 to the source circuitry 50 and the load circuitry 52. Indeed, the positive supply voltage 162 may help overcome the effects of voltage dip and other inaccuracies caused by the distance similar to the path 56 by insuring that the voltage at point 107 and point 109 are the same or approximately the same. This will operate to cancel any discrepancies that would cause the VDD140 to be lower than the VDD 120, for example by 50 mV, as will be discussed in greater detail below.

This result of having the voltages at point 107 and point 109 being equal or approximately equal can be achieved through the inclusion of additional circuitry in each of the source circuitry 50 and the load circuitry 52, for example, transistors 128 and 148, respectively, which each receive the positive supply voltage 162 at the respective gates. In some embodiments, the transistors 128 and 148 may be, for example, NMOS transistors and, more particularly, can be N channel zero voltage transistors, although other types of transistors can be utilized instead. As illustrated, the voltage at point 107 will be the positive supply voltage 162 minus Vt of the transistor 128. Likewise, the voltage at point 107 will be the positive supply voltage 162 minus Vt of the transistor 148. In this manner, the voltages at each of point 107 and point 109 are clamped.

To insure that the voltage at point 107 and point 109 is the same or approximately the same, the positive supply voltage 162 and/or the transistors 128 and 148 may be selected to generate a desired voltage at each of point 107 and 109. For example, if the positive supply voltage 162 is set to 0 V and the Vt of each of transistor 128 and transistor 148 is 200 mV (i.e., through selection of transistors 128 and 148 having this Vt characteristic), then the voltage at each of point 107 and point 109 will be clamped in a manner similar to that described above with respect to transistors 84 and 88 in FIG. 4, thus "eating" or "absorbing" the voltage difference between VDD 120 and VDD 140 and ensuring that the voltages at points 107 and 109 are the same or approximately the same (i.e., to ensure the accurate operation of the current mirror 57 of the source circuitry 50 and the load circuitry 52).

In some embodiments, the positive supply circuitry 160 may functionally similar to the ground generating circuitry 100 and may be located on the memory bank 12. However, alternate locations for the positive supply circuitry 160 in the memory device 10 are envisioned. To generate the positive supply voltage 162, the positive supply circuitry 160 may include a positive supply voltage VDD 164 (e.g., a regulated voltage supply with a voltage of, for example, 1.2V) connected to one or more of transistor 166 and transistor 170. Transistors 166 and 170 may be of a same type as transistors 128 and 148, for example, NMOS transistors and, more particularly, they can be N channel zero voltage transistors, although other types of transistors can be utilized instead. A path 168 may couple the gate and the drain of the transistor 166. Further, the source of the transistor 166 may be coupled to the drain of transistor 170. The transistor 170 may also have a path 172 to couple the gate of the transistor 170 and the drain of the transistor 170. A resistor 174 located on the positive supply circuitry 160 may establish the positive supply voltage 162 supplied to the source and load circuitries 50 and 52.

In operation, similar to the ground generating circuitry 100 of FIG. 4, the positive supply circuitry 160 may dynamically transmit the positive supply voltage 162 based on, for example, the types of transistors used for transistors 128, 148, 166, and 170 (each being similar types of transistors and, accordingly, having the same or substantially the same operating characteristics). Moreover, positive supply voltage 162 may resolve power dip by cancelling the effects of variation between the VDD 120 and the VDD 140. Further, in some embodiments, it may be useful to desirable to forgo the use of positive supply circuitry 160 and/or to eliminate the use of the positive supply voltage 162. The source circuitry 50 and the load circuitry 52 may each include a respective switch 130 and 150 that operate as a bypass switch for each of transistor 128 and 148 similar to the switches 86 and 90 discussed with respect to FIG. 4. Thus, employing a similar testing methodology to that previously described, if the current mirror 57 operates correctly with the switches 130 and 150 in a closed position, then little difference in VDD 120 and VDD 140 is present and there is no need to utilize the transistors 128 and 148 and/or the positive supply circuitry 160 (i.e., the transistors 128 and 148 and/or the positive supply circuitry 160 are disabled). If, however, during (post-manufacturing) testing the current mirror 57 is shown to fail when each of the switches 130 and 150 is closed, the switches 130 and 150 can be opened, thus utilizing the transistors 128 and 148 and/or the positive supply circuitry 160 in the manner discussed above. However, it should also be appreciated that there may be other reasons to forgo use of the transistors 128 and 148 and/or the positive supply circuitry 160, such as cost, efficiency, and the like.

Furthermore, it should be noted that the headroom issues mentioned in the description of FIG. 4 may also be present in the embodiment illustrated in FIG. 5. Accordingly, the transistors 166 and 170 may, as described in FIG. 4, have selective threshold voltages to ensure that the positive supply voltage 162 is high enough to overcome the difference between the VDD 120 and VDD 140 and low enough to avoid headroom issues in the transistors 122 and 142.

In some embodiments, there may be a combination of power dips and ground bounces in the source and load circuitries 50 and 52. Accordingly, the features of the ground generating circuitry 100 in FIG. 4 and the positive supply circuitry 160 of FIG. 5 may be combined to provide adjusted drain and source voltages to the transistors in the source and load circuitries 50 and 52 affected by said discrepancies.

While only certain features of the present disclosure have been illustrated and described herein, many modifications and changes will occur to those skilled in the art. For example, signal polarity for assertions may be inverted for at least some signals where a logic low is an assertion while a logic high is a de-assertion. It is, therefore, to be understood that the appended claims are intended to cover all such modifications and changes as fall within the true spirit of the embodiments described herein.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

The invention claimed is:

1. A device, comprising:
source circuitry comprising a first portion of a current mirror and a first transistor coupled to the first portion of the current mirror;
load circuitry comprising a second portion of the current mirror and a second transistor coupled to the second portion of the current mirror, wherein the load circuitry is disposed in a first memory array at a distance from a second memory array in which the source circuitry is disposed; and
a path coupled to a first gate of the first transistor and to a second gate of the second transistor, wherein the path provides a predetermined voltage to both of the first gate of the first transistor and to the second gate of the second transistor.

2. The device of claim 1, wherein the first transistor is disposed between a first negative supply voltage of the source circuitry and the first portion of the current mirror.

3. The device of claim 2, wherein the second transistor is disposed between a second negative supply voltage of the load circuitry and the second portion of the current mirror.

4. The device of claim 3, comprising a first switch disposed in parallel with the first transistor.

5. The device of claim 4, comprising a second switch disposed in parallel with the second transistor.

6. The device of claim 5, wherein each of the first switch and the second switch when in operation are placed into an open state based upon a determination of a difference in a first voltage level of the first negative supply voltage and a second voltage level of the second negative supply voltage.

7. The device of claim 1, wherein the first transistor is disposed between a first positive supply voltage of the source circuitry and the first portion of the current mirror.

8. The device of claim 7, wherein the second transistor is disposed between a second positive supply voltage of the load circuitry and the second portion of the current mirror.

9. The device of claim 8, comprising a first switch disposed in parallel with the first transistor.

10. The device of claim 9, comprising a second switch disposed in parallel with the second transistor.

11. The device of claim 10, wherein each of the first switch and the second switch when in operation are placed into an open state based upon a determination of a difference in a first voltage level of the first positive supply voltage and a second voltage level of the second positive supply voltage.

12. A device, comprising:
source circuitry comprising a first portion of a current mirror and a first transistor coupled to the first portion of the current mirror;
load circuitry comprising a second portion of the current mirror and a second transistor coupled to the second portion of the current mirror, wherein the load circuitry is disposed in a first memory array at a distance from a second memory array in which the source circuitry is disposed; and
voltage generation circuitry coupled to each of the source circuitry and the load circuitry, wherein the voltage generation circuitry when in operation generates a reference voltage and transmits the reference voltage to both of a first gate of the first transistor and to a second gate of the second transistor.

13. The device of claim 12, wherein the first transistor is disposed between a first negative supply voltage of the source circuitry and the first portion of the current mirror, wherein the second transistor is disposed between a second negative supply voltage of the load circuitry and the second portion of the current mirror.

14. The device of claim 13, wherein the voltage generation circuitry comprises a third transistor and a fourth transistor each having first operational characteristics approximately equivalent to second operational characteristics of the first transistor and the second transistor.

15. The device of claim 14, wherein the voltage generation circuitry generates the reference voltage having a first voltage level based in part on the first operational characteristics.

16. The device of claim 12, wherein the first transistor is disposed between a first positive supply voltage of the source circuitry and the first portion of the current mirror, wherein the second transistor is disposed between a second positive supply voltage of the load circuitry and the second portion of the current mirror.

17. The device of claim 16, wherein the voltage generation circuitry comprises a third transistor and a fourth transistor each having first operational characteristics approximately equivalent to second operational characteristics of the first transistor and the second transistor.

18. The device of claim 17, wherein the voltage generation circuitry generates the reference voltage having a first voltage level based in part on the first operational characteristics.

* * * * *